United States Patent [19]

Vaillancourt et al.

[11] Patent Number: 4,760,343
[45] Date of Patent: Jul. 26, 1988

[54] APPARATUS FOR DETECTING DEFECTIVE INSULATORS IN AN INSULATING COLUMN SUPPORTING AN ELECTRICAL CONDUCTOR IN A POWER CIRCUIT LINE

[75] Inventors: Georges H. Vaillancourt, Beloeil; Farouk Rizk, St-Lambert, both of Canada

[73] Assignee: Hydro-Quebec, Montreal, Canada

[21] Appl. No.: 843,491

[22] Filed: Mar. 17, 1986

[51] Int. Cl.⁴ .................. G01R 29/12; G01R 19/00; G01N 31/02
[52] U.S. Cl. .............................. 324/552; 324/530; 324/559; 324/456; 324/458
[58] Field of Search ............... 324/551, 552, 530, 536, 324/457, 109, 72, 456, 559, 456, 458

[56] References Cited

U.S. PATENT DOCUMENTS

| | | | |
|---|---|---|---|
| 1,542,815 | 6/1925 | Bennett | 324/552 |
| 1,896,598 | 2/1933 | Spangler | 324/552 |
| 4,266,184 | 5/1981 | Devine | 324/552 |
| 4,328,461 | 5/1982 | Butters | 324/72 |
| 4,571,539 | 2/1986 | Rodriguez | 324/457 |

FOREIGN PATENT DOCUMENTS

| | | | |
|---|---|---|---|
| 2559270 | 8/1985 | France | 324/457 |
| 502453 | 11/1954 | Italy | 324/149 |
| 1045170 | 9/1983 | U.S.S.R. | 324/457 |

OTHER PUBLICATIONS

Spiegel: "An Improved Optical Isolated ELF Electric Field Sensor", 1979, Symposium on EM Compatibility-pp. 429/434 (10/1979).

Primary Examiner—Reinhard J. Eisenzopf
Assistant Examiner—Jose M. Solis
Attorney, Agent, or Firm—Oblon, Fisher, Spivak, McClelland & Maier

[57] ABSTRACT

A method and apparatus for detecting defective insulators in an insulating column supporting an electrical conductor in a power line. The column is made of a plurality of serially connected insulator members. Voltage present on the conductor supported by the column generates an electric field about it. The presence of faulty insulators within the column causes field redistribution and discontinuities in it. A specially configured electric field probe is provided to measure at predetermined distance and locations, this electric field. A displacement device is provided whereby to displace the probe along an axis substantially parallel along the length of the column to automatically obtain measurements. Means to analyze the measurements are provided and allow to identify the defective insulators whose positions correspond to the locations of the discontinuities in the electric field surrounding the column. The main advantage of this method is that no electrical contact need to be made to the insulators.

25 Claims, 4 Drawing Sheets

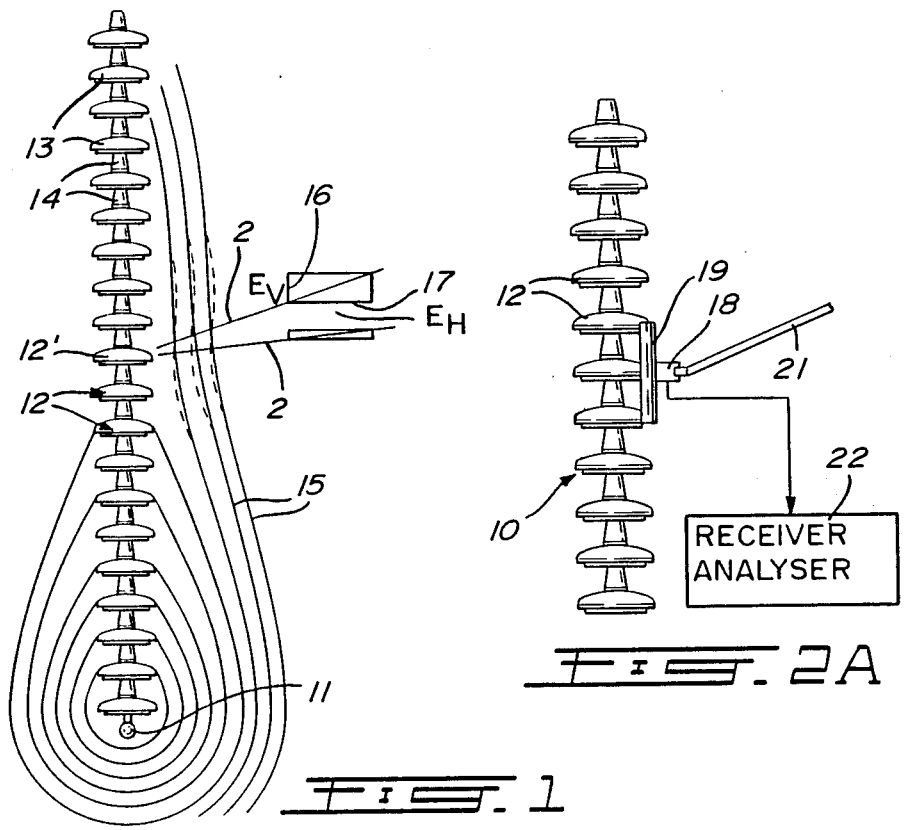
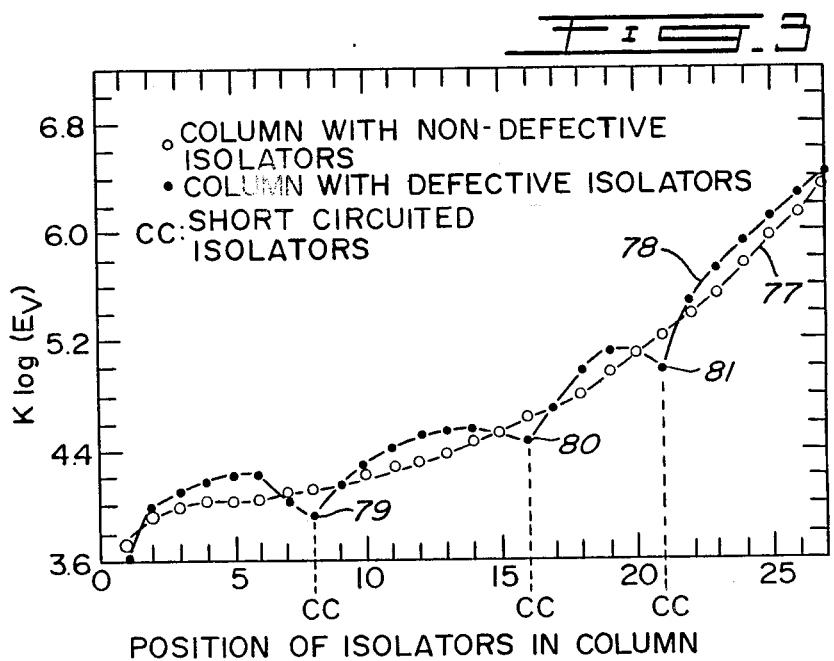

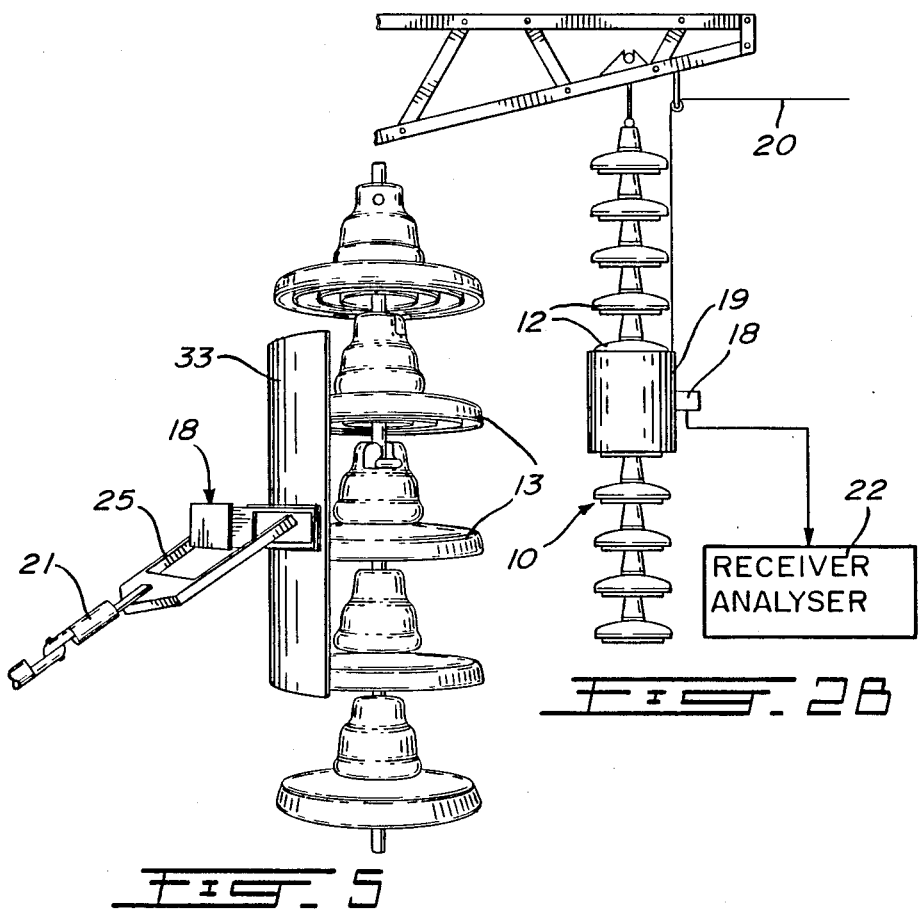
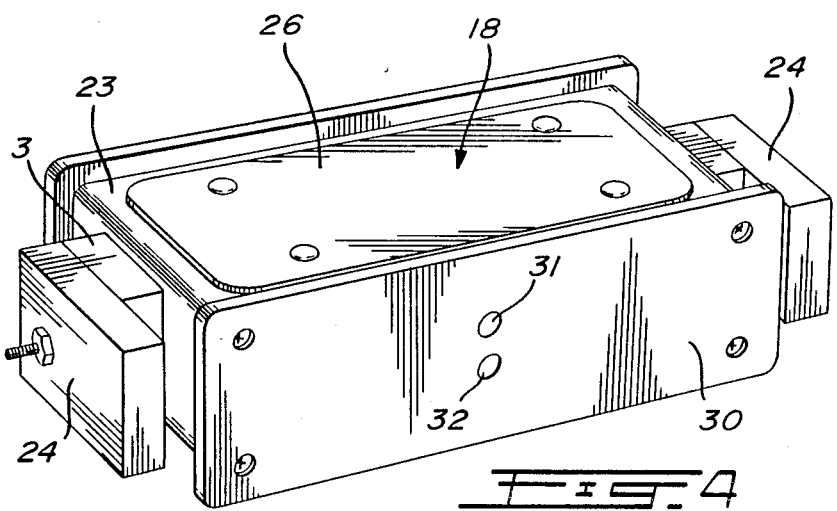

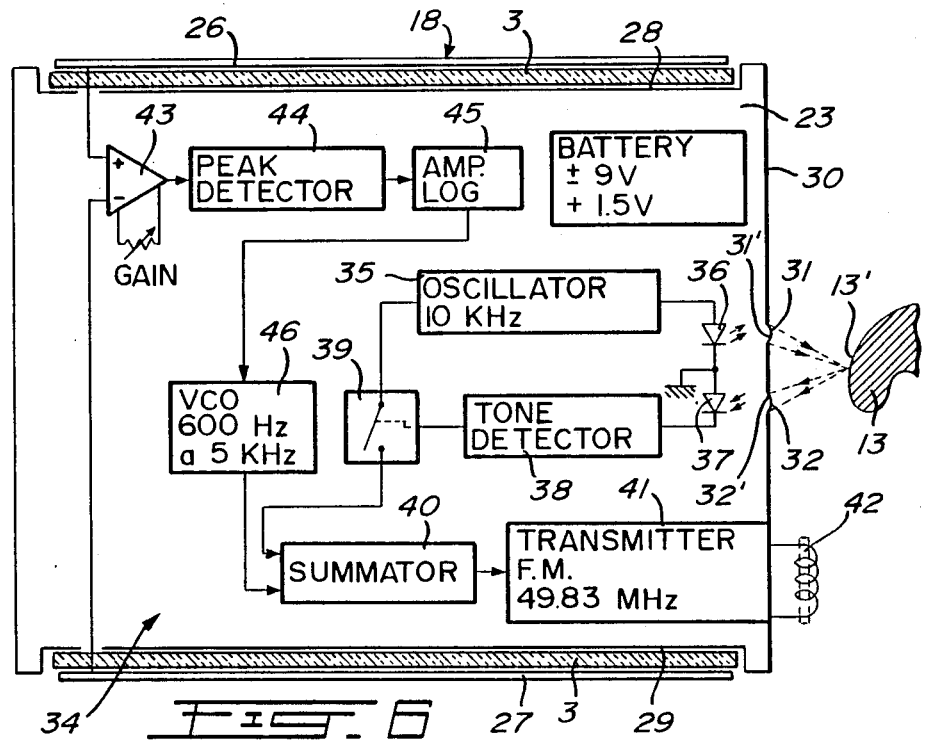
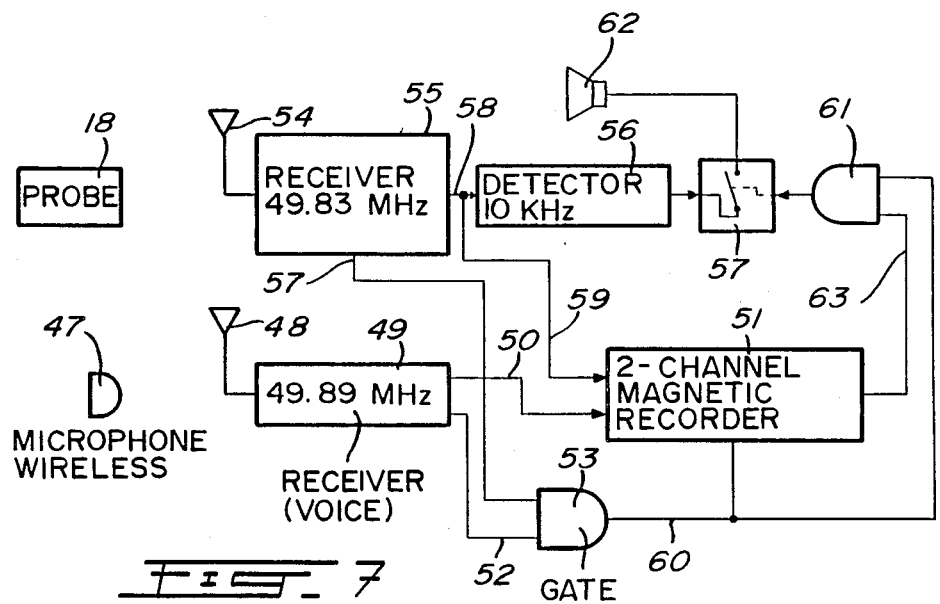

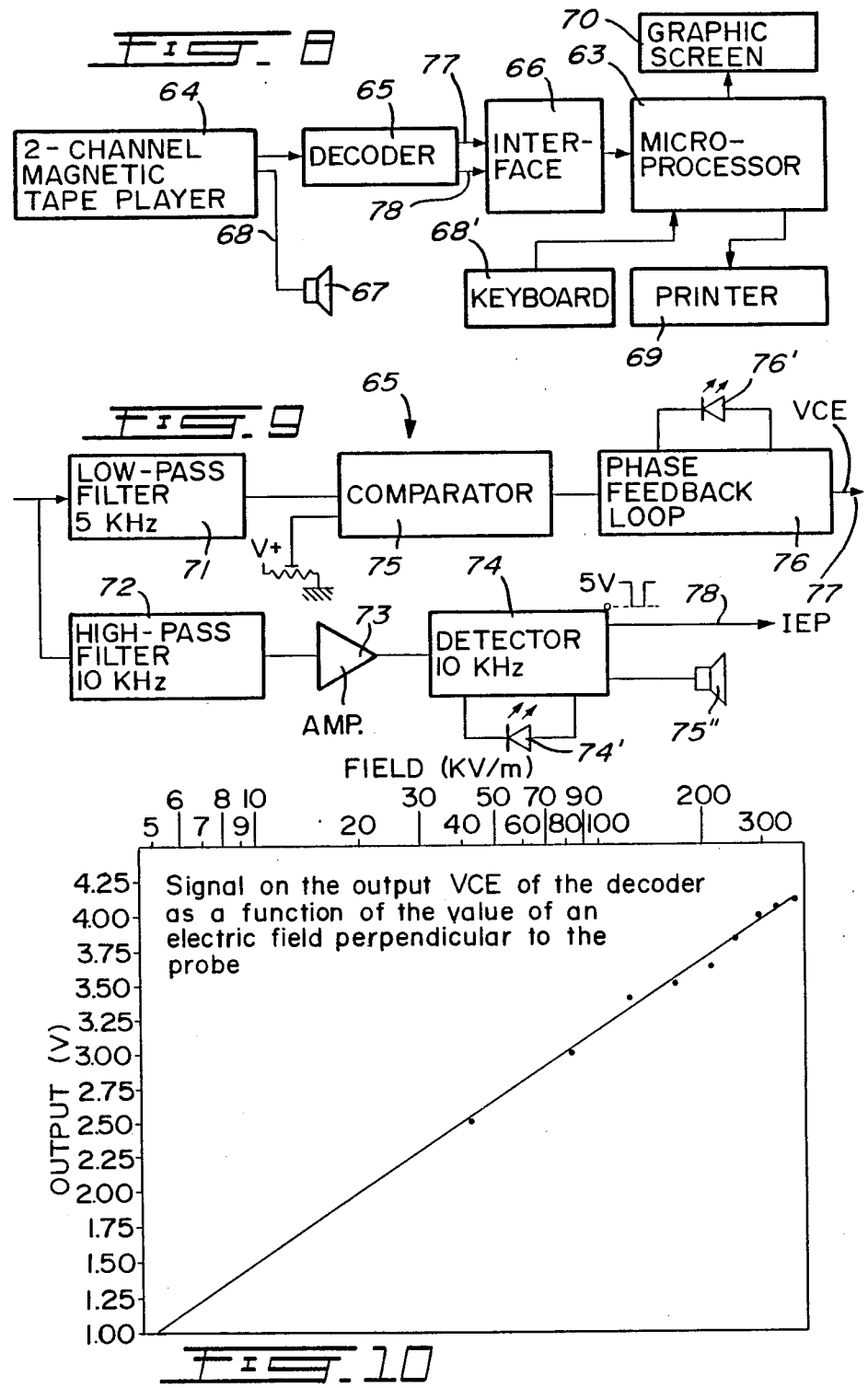

APPARATUS FOR DETECTING DEFECTIVE INSULATORS IN AN INSULATING COLUMN SUPPORTING AN ELECTRICAL CONDUCTOR IN A POWER CIRCUIT LINE

BACKGROUND OF THE INVENTION

1. Field of the Invention

The present invention relates to an apparatus for detecting, without electrical contact defective insulators in an insulating column supporting an electrical conductor in a power line and wherein the column is formed of a plurality of serially connected insulators.

2. Description of Prior Art

In order to support the electrical conductors in a power line network, porcelain disk-type insulators are connected together to form support columns for the electrical conductors. The number of insulators in the column varies as the function of the intensity of the voltage present on the conductor supported thereby. For example, with a line voltage of 735 KV present on a conductor, there may be required as much as 35 insulators in each column in order to have adequate insulation at all atmospheric conditions for the proper functioning of the power circuit. Often, with aging, some of the porcelain insulators will develop interior fissures thereby short-circuiting themselves. When this occurs, the dielectric property of the column is reduced without any exterior visual signs. If various porcelain insulators, in the same column, develop internal fissures or short circuits, this could cause a failure in the power line.

It is a well known fact that these insulating columns have an electric field developed thereabout and which field has a particular characteristic depending on the length of the column and the intensity of the voltage present on the conductor as well as the geometry and the composition of the structure supporting the conductor(s). Accordingly, there is induced voltage within the column when voltage is present on the conductor and it reduces in intensity along the column as we are further away from the conductor supported thereby to reach a minimum value at a distance of about one third its total length from its attach point to the supporting structure. One conventional method of verifying the operability of these porcelain insulators, and the simplest one, consists in occasionally placing a temporary short circuit across each of the insultators in the column. If the insulator being verified is in a good operative condition, there will exist a difference in potential across the insulator and by placing and removing a short circuit thereacross, by means of a jumper wire, a spark will occur at the end of the jumper wire and produce an audible sparking sound. If the porcelain insulator is short-circuited interiorly by a carbonized fissure, the jumper will not produce any sound or will produce a very faint sound as the potential on each side of the insulators is practically the same. Accordingly, the prior method is entirely dependent upon the audible and visual senses of an operator to detect defective insulators.

The above-described method of the prior art has many disadvantages. For example, it is dependent upon the effective hearing of the person which places the jumper wire across the insulators. Also, this jumper wire is usually supported at the end of a long insulated stick and accordingly, the method of placing the jumper wire in proper position is difficult and slow principally if errors are to be minimized. Further, each insulator within the column must be tested and as mentioned above, often a single column may have thirty-five of these insulators. This prior art method is also subject to error as the operator can make a mistake when counting and identifying each of the insulators in the column. Accordingly, it is likely that a good insulator may be replaced and a defective one left in the column when the results provided by the operator are studied and corrective action is taken. Also, this prior art method presents a danger to both the operator and the power line, for the reason that in a situation where many insulators may be defective in a column an additional short circuited insulator in a column could result in the entire current in the line redirecting itself to ground thus presenting a danger to the operator.

One second conventional method consists in measuring the induced potential across each insulator in the column by means of a probe meter which is used to read voltage across each insulator as described in U.S. Pat. No. 1,542,815, "Instrument for Locating and Observing Defective Insulator Units" by Claudius E. Bennett, June 23, 1925 and Italian Pat. No. 502453, "Apparecchio per individuare gli isolatori guasti o difettosi montati su linee elettriche in tensione" by Cesare Castelli, Nov. 30, 1954. The main disadvantage of these apparatus is that the two probe tips have to be placed across each insulator in the column which is difficult and time consuming on long columns: moreover, reading the meter with the unaided eyes is also very difficult.

One third method consists in measuring leakage resistance of each insulator in the column. It is usually done by applying a DC voltage across the insulator and measuring the resulting current. One refined example of this technique is described in U.S. Pat. No. 4,266,184, "Method and Apparatus for Testing Insulators" by Clifford W. Devine. The main disadvantage of this method is again positioning the probe tips across each insulator.

SUMMARY OF INVENTION

It is a feature of this invention to provide a novel method and apparatus which substantially overcomes all of the above-mentioned disadvantages of the prior art.

Another feature of this invention is to provide an apparatus for detecting defective insulators in an insulating column supporting an electrical conductor in a power line network and wherein the apparatus is safe and easy to use, and requires a shorter length of time to verify a column of insulators and further provides automatic testing of each of the insulators, and wherein the verification is substantially error free and safe since it is made without making electrical contact with the insulators.

Another feature of this invention is to provide a method for detecting defective insulators in an insulating column supporting an electrical conductor and which method is based on the principle that a defective insulator in the insulating column causes a discontinuity in the electrical field existing about the column and wherein the said method is capable of automatically detecting this discontinuity in the electric field and thereby identifying those insulators which are defective.

According to the above features, from a broad aspect, the present invention provides an apparatus for detecting defective insulators in an insulating column supporting an electrical conductor in a power circuit. The column is constructed of a plurality of serially connected insulators. The apparatus comprises a probe having detection circuit means for measuring, at predetermined locations, the axial component of an electric field generated about the column by voltage present on the conductor supported thereby. Means are also provided for displacing the probe along an axis substantially parallel to the column to obtain measurements along the column at the predetermined locations.

According to another aspect of the present invention, there is provided a method of detecting defective insulators in an insulating column which is comprised of a plurality of serially connected insulators supporting an electrical conductor in a power circuit line. The method comprises displacing a measurement probe along an axis substantially parallel to the column. A measurement of the axial component of an electric field existing about the column is then measured at predetermined locations along the column to produce measurement signals. The measurement signals are then recorded.

BRIEF DESCRIPTION OF DRAWINGS

A preferred embodiment of the present invention will now be described with reference to the examples thereof as illustrated in the accompanying drawings in which:

FIG. 1 is a schematic view of an insulating column consisting of a plurality of serially connected porcelain insulators and further illustrating a typical equipotential field produced about the column by an electric field generated by the voltage present on the electrical conductor supported thereby;

FIGS. 2A and 2B are further schematic views showing a section of an insulating column and a schematic representation of the detection apparatus of the present invention;

FIG. 3 is a characteristic curve illustrating a plurality of measurements taken along an insulating column and having three defective insulators therein;

FIG. 4 is a perspective view of one example of the construction of the probe;

FIG. 5 is a perspective view showing the probe of FIG. 4 connected to a guide frame;

FIG. 6 is a schematic diagram of the detection and measuring circuit associated with and contained within the probe;

FIG. 7 is a schematic diagram showing an example of the receiving and recording circuit;

FIG. 8 is a schematic diagram of the analyzing circuit;

FIG. 9 is a schematic diagram of the decoder; and

FIG. 10 is a characteristic curve of the signal at the output of the decoder as a function of a uniform electric field disposed perpendicularly to the probe.

DESCRIPTION OF PREFERRED EMBODIMENTS

Referring now to the drawings and more particularly to FIGS. 1, 2 and 3, there is shown generally at 10 an insulating column supporting an electrical conductor 11, as utilized in a high voltage power network. The column 10 is formed of a plurality of serially connected insulators 12. Each insulator 12 consists of a porcelain disk 13, and a metal support connector 14. The disk 13 and the connector 14 are connected together in a manner well known in the art.

The method of operation of the detecting apparatus of the present invention is based on the principle that the electric field perpendicular to the equipotential lines 15 that originates on this insulating column due to high voltage present on the conductor 11, has an axial component $E_v$ and a radial component $E_h$, herein designated by vectors 16 and 17 respectively. When an insulator 12 is defective in an insulating column, we can demonstrate that the electrical field distribution lines 2 perpendicular to the equipotential lines 15 in the area or vicinity of the defective insulator 12' orient themselves in a direction substantially perpendicular or radially to the axis of the column. This is theoretically demonstrated in FIG. 1 where the disk of the insulator 12' is defective. This orientation of the electric field is produced by the fact that support connectors 14 are substantially at the same potential on both sides of the porcelain insulator 12'.

By measuring the axial component of the electric field in front of the insulator 12', we obtained a measurement appreciably inferior to those measurements obtained opposite the disk on each side of the defective insulator. FIG. 3 clearly illustrates these results. In order to detect the defective insulating disk, it is necessary to measure, by means of a probe, the axial component of the electric field adjacent each of the insulating disks throughout the column. These measurements are then reproduced on a graph to produce the curve as shown in FIG. 3 and by analyzing the graph, the exact defective disk in a column can be identified. This method can be effected in a quasiautomatic manner by using the apparatus of the present invention, an example of which is illustrated in FIG. 2.

As shown in FIG. 2, the detection apparatus is comprised of a probe 18 having associated detection circuit means, which will be described later, for measuring at predetermined locations, the axial component of an electrical field generated about the insulated column 10. The probe 18 is associated with a means to permit it to be displaced along the column 10 in an axis substantially parallel to the column. this can be accomplished by at least two different means depending on the particular utilization of the system. Firstly, as illustrated in FIG. 2A, the probe 18 is fixed to a support guide which is constituted by a section of a cylinder made of rigid or semi-rigid insulating material, which guide support rests on at least two disks, and preferably three disks, at one time. The outer peripheral outline of the disks also correspond to the transverse curve of the cylinder section. An insulating arm or column 21 is hingedly secured to the probe whereby the probe can be manipulated by an operator located on the supporting structure or in a cab secured to the end of a mechanical boom.

Secondly, as illustrated in FIG. 2B, the probe 18 may be secured to a guiding mechanism herein constituted by a cylinder 19 which is closely spaced about the outer periphery of the insulating disk 13 constituting the column 10. The guiding cylinder 19 extends along at least two, and preferably three, consecutive disks 13 in such a way as to permit the probe to be displaced along an axis which is substantially parallel to that of the column. A cable and pulley system 20 is herein utilized to displace the cylinder in order to sweep the entire column. An analyzing circuit 22 receives the signals from the detection circuit, which will be described later, associated with the probe 18 whereby to analyze or interpret the information signals to automatically record and analyze the measurement signals received from the probe detection circuits.

Referring now additionally to FIGS. 4 to 6, there is shown a preferred form of construction of the apparatus of the present invention. As hereinshown, the probe 18 comprises a conductive block or frame or housing 23 which houses therein the detection circuit. Fasteners 24 are secured to the insulating casing and extend from opposed end walls thereof. These fasteners 24 secure the conductive frame to a fork element 25 which is itself attached to the free end of the insulating rod 21. The probe is herein comprised by two plate-like electrodes 26 and 27 disposed substantially parallel to one another on opposed top and bottom walls 28 and 29, respectively, of the conductive housing 23. The electrodes are electrically insulated by insulators 3. The rectangular shape of the probe gives it a much better directivity than a spherical probe which is generally utilized to measure the electric field. The conductive housing 23 has a front face wall 30 of conductive material and a pair of apertures 31 and 32 are disposed in spaced apart manner in the face wall 30. These apertures 31 and 32 form part of a position detector which detects the exact location of the closest portion of the peripheral region of the insulating disks 13.

As shown in FIG. 5, the guide means is herein constituted by a section of a cylinder 33, constructed of insulating material and to which the probe is secured. This cylinder section must be sufficiently long to support and guide itself on the outer periphery of two or three successive insulators 12 whereby the probe 18 may be guided along an axis substantially parallel to the longitudinal axis of the column.

Referring now to FIG. 6, there is shown the construction of the detection circuit 34 which is housed within the conductive housing 23. This detection circuit 34 is connected to the two electrodes 26 and 27 which electrodes detect or sense the axial component of the electric field about the column 12.

The position detector circuit is comprised of a 10 kHz oscillator 35 feeding a frequency signal to an infrared light emitting diode 36 which will emit a light signal having a short range through the aperture 31 whereby to detect the peripheral region 13' of an insulating disk 13. This light signal will be reflected back to a detecting infrared diode 37 via the aperture 32 when the periphery of the disk 13 is positioned close to the apertures. Lenses 31' and 32' may be provided in the apertures to focus the signal. The diode 37 is connected to a detector circuit 38 and upon detection of a disk 13 it will activate switch relay 39 to cause the summator circuit 40 to feed a position signal along with the measured signal of the axial component of the electric field. A transmitter circuit 41 transmits a modulated radio frequency signal, via an antenna 42, to a receiving station remotely located. The signal may also be transmitted on an optical fiber line (not shown). This transmitter is modulated by two sub-carriers with one sub-carrier representing the logarithmic of the electric field value, converted to a frequency signal, which may vary between 600 and 5,000 Hertz, and the other sub-carrier is fixed at 10,000 Hz and is present or not depending on the switch closure indicating the presence of a position signal. This second sub-carrier is only present when the detector circuit 38 indicates the presence of the insulating disk 13, as shown in FIG. 6 thus permitting correlation of the measurement signals relative to the position of the disks. Both the signals of transmitter 41 or the optical fiber signals are unaffected by the high voltage in the line 11.

The electrodes 26 and 27 are each connected to positive and negative inputs of an amplifier 43 which is connected to a peak detector 44, a log amplifier 45 and voltage controlled oscillator 46 whereby to produce a sinusoidal signal proportional to the logarithmic value of the electric field. The frequency of this signal can vary between 600 and 5,000 Hz, depending on the intensity of the axial component in the electric field. FIG. 10 represents the correlation between the value of the electric field applied to the electrodes and the corresponding signal obtained at the output VCE of the decoder.

A schematic of the receiver and recording circuit is shown in FIG. 7. The Figure also illustrates the probe 18 as well as a wireless microphone 47. The operator which effects the verification of the insulators must initially switch on the power circuit for the probe and the microphone in order to establish a transmission link therebetween by the use of two carrier frequencies, namely 49.83 mHz for the probe and 49.89 mHz for the microphone. These carrier frequencies are received by the receivers 55 and 49 which are capable of receiving these signals. The outputs 57 and 52 of these receivers are connected to the magnetic recorder 51 which is activated thereby by means of the gate 53 and the connection 60 thereto.

The magnetic recorder 51 remains in operation as long as the presence of the two carriers continues to be indicated by the outputs 57 and 52 of the two receivers and as long as there is sufficient magnetic tape. The magnetic recorder is utilized to record the measuring signal received on the output 58 of the receiver 55 through the input 59 and the vocal signal received at the output 50 of the receiver 49. A 10 kHz detector 56 is connected to the output of the receiver 55 and is utilized to activate a horn 62 to produce an audible signal, this being done through the relay 57. This audible signal is generated each time the probe is displaced in front of the periphery of a disk in the insulator column. The audible signal gives a signal to the operator that the system is in operation and is recording the information signals received as the column is being swept by the probe. In the case when the two carrier frequencies are not present or if the magnetic tape is not in movement, the contact of the relay 57 remains open and the horn 62 is not activated.

Referring now to FIG. 8, there is shown a typical construction of the analyzer circuit. It is pointed out that this analyzer circuit could be incorporated with the receiver circuit of FIG. 7 as on on-site device. However, because of the use of a micro-computer 63 therein, it is preferable to analyze the magnetically recorded information in a laboratory where the equipment is in permanent installation and capable of automatically generating a printed report which identifies each insulating column tested and the operative conditions of the insulators therein. As shown in FIG. 8, there is provided a two-channel magnetic player device 64 in order to play back the magnetic recording medium, here a magnetic tape, in order to extrapolate therefrom the information signal and the measurement signals. The decoder 65 transforms the recorded signals on the tape into two voltage signals. The first signal "IEP" is normally at +5 volts and diminishes to zero when the 10 kHz position detector signal is present on the recorded medium. The second output signal "VCE" is proportional to a constant K multiplied by the log of the axial component of the electrical field $E_y$. These two signals "IEP" and "VCE", are then fed to a micro-computer 63 via interface circuit 66. The program of this micro-computer 63 is of the "inter-active" type, that is to say, questions are directed to an operator which enters information provided by the speaker 67 connected to voice output 68 of the magnetic player device 64 by means of a keyboard 68' in a manner well known to a person skilled in the art. This information contains the identifications signals identifying the specific insulating column being tested and commencement and termination of test signals. The micro-computer 63 may have various information recording devices connected thereto and as hereinshown, a printer 69 is provided to print all of the identification signals and measurement signals. A graph as shown in FIG. 3 may also be displayed and printed by a graphic screen 70 and associated equipment.

FIG. 9 is a block diagram showing the construction of the decoder circuit 65. As shown, the decoder has two input filters, namely low-pass filter 71 and high-pass filter 72 whereby to separate the position detection 10 kHz signal from the measurement signals. The high-pass filter 72 is connected to an amplifier 73 which feeds a detector device 74 to convert the signal into a 5 volt DC level signal, falling to zero voltage each time a 10 kHz position detection signal is sensed. A horn 75' is connected to the output of a detector device 74 for the benefit of the operator analyzing the information on the magnetic tape. The low-pass circuit 71 is connected to a comparator circuit 75 to convert the analog signal into a digital signal which is then fed to a phase-lock circuit 76, producing on its output the signal VCE which is between 0 and 5 volts and indicative of the measured vertical component of the electric field. As hereinshown, both the detector 74 and phase-lock loop circuit 76 are each provided with a light emitting diode 74' and 76' to indicate the presence of a position signal and measurement signal.

Referring again to FIG. 3, there is shown a typical characteristic curve of the actual measurements of an insulating column taken with the apparatus of the present invention. The particular column tested was composed of thirty (30) insulators, represented on the horizontal scale. The time required to scan the entire insulating coumn was approximately 20 seconds. During the laboratory test, the voltage on the conductorwas 425 Kv phase-ground which corresponds to a line voltage of 735 Kv. In order to convert the values obtained with the probe into real values of the electric field, a calibration was effected the results of which are illustrated by the characteristic curve shown in FIG. 10. As shown in FIG. 3, the curve 77 illustrative a column having no defective insulators. The curve 78 indicates the actual measured axial component of the electric field with defective insulators. As can be seen, the eighth, sixteenth and twenty-first insulators were defective, as indicated by the lowered value of the axial component of the measured electrical field at positions 79, 80 and 81, respectively. Thus, by analyzing these curves, the defective insulators can be accurately detected and replaced. Various other tests were effected by placing two defective insulators side-by-side or at the end of a column where the values of the electric field are weaker and the system and method were found to be adequate to detect such defective insulators regardless of their position along the column, as long as there was a weak electric field in the vicinity of these insulators it was possible to detect a defective one.

Summarizing, the method comprises the operation of a novel detecting apparatus to identify defective insulators in an insulating column and it simply consists in the operator transmitting a voice signal whereby to identify the insulating column to be tested and thereafter displaces a measuring probe along an axis substantially parallel to and entirely along the column. The measurement of the axial component of the electrical field is made automatically by a detection circuit and signals are recorded and analyzed to produce a report as to the operative condition of each of the insulators in a specific insulated support column.

It is within the ambit of the present invention to cover any obvious modifications of the example of the preferred embodiment described herein, provided such modifications fall within the scope of the appended claims. For example, the identification signal may not necessarily be a voice signal, but could be a coded signal. Also, it may be possible simply to correlate a multitude of measured signals with a report identifying how many and which columns were tested over a specific time frame, thus doing away completely with the voice signal. Also, a bar code may be attached to each column or to its supporting structure and read by a detector incorporated in the system of the probe.

We claim:

1. A method of detecting, without making electrical contact, defective insulators in an insulating column comprised of a plurality of serially connected insulators for supporting an electrical conductor in a power transmission line, said column being surrounded by an electric field caused by the voltage present on said conductor; said method comprising the steps of:
   (i) displacing an electric field probe along an axis substantially parallel to the longitudinal axis of said column,
   (ii) effecting measurement of the electric field surrounding said column to detect discontinuities in this field that are caused by the presence of faulty insulators within said column, and
   (iii) interpreting measured field values to identify faulty insulators in said column.

2. A method as claimed in claim 1 wherein after step (ii) there is provided the step of transmitting a measurement signal from each said predetermined positions.

3. A method as claimed in claim 2 wherein in step (iii) there is provided the step of analyzing said identification and measurement signals whereby to detect the operative conditions of said insulators in said column.

4. A method as claimed in claim 2 wherein there is further provided the step of generating an audible signal each time said predetermined positions are detected.

5. A method as claimed in claim 3 wherein said step of analyzing said signals comprises:
   (a) decoding said recorded measurement signals,
   (b) producing digital and analog signals relative to said measurement signals, and
   (c) printing and plotting on a graph the results of said measurement signals and position signal whereby to establish the operative condition of each insulator in the column tested.

6. An apparatus for locating defective insulators in an insulating column supporting an electrical conductor in a power transmission line and wherein said column is made up of serially connected insulators, said apparatus comprising: field responsive means in the form of an electric field probe, means for guiding and displacing said electric field probe along an axis substantially parallel to the longitudinal axis of said column to perform electric field measurement at predetermined positions along the column, means to count said insulators as said electric field probe is displaced and to locate said predetermined positions where to obtain electric field values, means to transmit electric field values and position signals, means to receive and record said insulator count and said electric field values, andmeans to analyze and relate said electric field values to the health condition of the individual insultators composing the said insulating column.

7. An apparatus as claimed in claim 6 wherein said field responsive means is a probe which comprises a pair of spaced apart electrodes supported in parallel relationship on a probe support frame with said probe oriented substantially along a plane transverse to the longitudinal axis of said column.

8. An apparatus as claimed in claim 6 wherein said means to count said insulators comprises a detector which is actuated to effect a closure when an outer rim of each insulator in said column is sensed by a receiver element whereby to effect a measure of said electric field, and said means to transmit is a frequency transmitter for transmitting signals representative of said measured electric field values and position signals.

9. An apparatus as claimed in claim 8 wherein said transmitter is a high frequency transmitter having a carrier frequency unaffected by high voltage present on said conductor.

10. An apparatus as claimed in claim 8 wherein said transmitter is an optics transmitter connected to an optical fiber.

11. An apparatus as claimed in claim 8 wherein said transmitter is a piece of electrical conductor.

12. An apparatus as claimed in claim 8 wherein said means to receive is a receiver circuit means having a receiving channel for receiving measurement signals transmitted thereto by said transmitter associated with said detector, and recording means for recording said position signal along with said electric field measurement signal.

13. An apparatus as claimed in claim 12 wherein said recording means has a magnetic recording element for storing said position signal and said electric field measurement signal, said recording means being activated automatically when said electric field probe is switched on.

14. An apparatus as claimed in claim 12 wherein there is further provided an audible transmitting circuit connected to said receiving channel for generating an audible sound when said electric field probe is displaced close to the outer rim of each insulator element comprising said insulating column.

15. An apparatus as claimed in claim 14 wherein said audible transmitting circuit comprises a frequency detector connected to a switch whereby to activate a loudspeaking element whenever said electric field probe is at said predetermined positions for effecting a measurement and wherein a position signal is present.

16. An apparatus as claimed in claim 13 wherein there is further provided an analyzing circuit for decoding said measurement signals recorded on said magnetic recording element and producing digital and along outputs which are fed to a microprocessor where printed data is produced in the form of a graph to identify the condition of each said insulators in said column.

17. An apparatus as claimed in claim 7 wherein there is further provided a guide frame for supporting and guiding said electric field probe at a constant distance relative to said insulators along said column.

18. An apparatus as claimed in claim 17 wherein said guide frame comprises a cylinder section of rigid or semirigid insulating material disposed about a section of said column and extending to the outer peripheral area of at least two successive insulators whereby said probe is guided along an axis parallel to the longitudinal axis of said column.

19. An apparatus as claimed in claim 18 wherein there is further provided displacement means to effect said guided displacement of said probe along said column.

20. An apparatus as claimed in claim 19 wherein said displacement means is an elongated insulated boom pivotally connected at one end to said guide frame whereby an operator can displace said guide frame against said column by manipulating the opposite end of said boom.

21. An apparatus as claimed in claim 19 wherein said displacement means is an insulated chain or cable and pulley support disposed adjacent to said column to guide a cylindrical shaped support frame which is displaced along said axis by means of an elongated insulated boom.

22. An apparatus as claimed in claim 19 wherein said displacement means is an insulated chain or cable and pulley support disposed adjacent to said column to guide a cylindrical shaped support which is displaced along said axis by the action of gravity.

23. An apparatus as claimed in claim 7 wherein said support frame is a conductive casing housing therein said detection circuit means, fastener means in opposed end walls of said casing for connecting said support frame to said guide frame, said electrodes being plate electrodes secured to an associated one of opposed top and bottom walls of said conductive casing, a face wall formed by said casing, a pair of apertures in said face plate for the transmission and reception of detection signals associated with said transmitter receiver means.

24. An apparatus as claimed in claim 14 wherein said guide frame is constituted by a section of a cylinder formed of rigid insulating material and connected to a respective one of said opposed end walls of said casing.

25. An apparatus as claimed in claim 14 wherein a fork member is pivotally connected to said fastener means, and an elongated insulating boom is connected to said fork member.

* * * * *